US012573444B2

(12) United States Patent
Devaux

(10) Patent No.: US 12,573,444 B2
(45) Date of Patent: Mar. 10, 2026

(54) MEMORY DEVICE AND METHOD FOR PROTECTING A MEMORY DEVICE FROM THE EFFECT OF ROW HAMMERING

(71) Applicant: QUALCOMM Technologies, Inc., San Diego, CA (US)

(72) Inventor: Fabrice Devaux, Lausanne (CH)

(73) Assignee: Qualcomm Incorporated, San Diego, CA (US)

( * ) Notice: Subject to any disclaimer, the term of this patent is extended or adjusted under 35 U.S.C. 154(b) by 103 days.

(21) Appl. No.: 18/284,822

(22) PCT Filed: Mar. 22, 2022

(86) PCT No.: PCT/FR2022/050523

§ 371 (c)(1),
(2) Date: Sep. 28, 2023

(87) PCT Pub. No.: WO2022/207999

PCT Pub. Date: Oct. 6, 2022

(65) Prior Publication Data

US 2024/0185910 A1 Jun. 6, 2024

(30) Foreign Application Priority Data

Mar. 29, 2021 (FR) .................................. FR2103163

(51) Int. Cl.
*G11C 11/00* (2006.01)
*G11C 11/406* (2006.01)
(Continued)

(52) U.S. Cl.
CPC .... *G11C 11/4078* (2013.01); *G11C 11/40615* (2013.01); *G11C 11/40618* (2013.01); *G11C 11/408* (2013.01); *G11C 29/52* (2013.01)

(58) Field of Classification Search
CPC .......... G11C 11/40615; G11C 11/4087; G11C 11/40603; G11C 11/4085;
(Continued)

(56) References Cited

U.S. PATENT DOCUMENTS

| 1,160,124 A | 11/1915 | Andreas |
| 1,160,172 A | 11/1915 | Heyman |

(Continued)

OTHER PUBLICATIONS

International Written Opinion for PCT/FR2022/050523, Jul. 4, 2022, 4 pages.
(Continued)

*Primary Examiner* — Thong Q Le
(74) *Attorney, Agent, or Firm* — Withrow & Terranova, PLLC

(57) ABSTRACT

The invention relates to a method for protecting a memory device (1) from the effect of row hammering. The memory device (1) comprises a DRAM unit (U) formed by a plurality of memory point matrices (MAT1-MATN) subdivided into a plurality of memory blocks (B1-BM). The memory device (1) comprises activation counters (CTR1-CTRM) respectively associated with the memory blocks (B1-BM). The method comprises the execution, with each activation of a row of a given block (Bi), of a step of incrementing the activation counter (CTRi) associated with the given block (Bi); and the initiation of the preventive refresh of all the rows of the given block (Bi) when the activation counter (CTRi) of this given block (Bi) exceeds a threshold value (Si). The protection method also comprises at least one of the operations aimed at: —including, in the preventive refresh, at least some of the rows of at least one block directly adjacent (Bi+1, Bi−1) to the given block (Bi); —incrementing, during the activation of the row or of certain rows of the given block (Bi), the activation counter (CTRi−1, CTRi+1) of at least one block directly adjacent
(Continued)

(Bi−1, Bi+1) to the given block (Bi) and initiating the preventive refresh of all the rows of the adjacent block (Bi−1, Bi+1) when the activation counter (CTRi−1, CTRi+1) associated with this adjacent block (Bi−1, Bi+1) exceeds a threshold value (Si−1, Si+1).

16 Claims, 3 Drawing Sheets

(51) Int. Cl.
  *G11C 11/4078* (2006.01)
  *G11C 11/408* (2006.01)
  *G11C 29/52* (2006.01)

(58) Field of Classification Search
  CPC . G11C 11/40618; G11C 29/52; G11C 29/028; G11C 11/403; G11C 11/406; G11C 2029/1202; G11C 29/70; G11C 29/76; G11C 29/783; G11C 8/14; G11C 11/40611; G11C 11/40622; G11C 11/4074; G11C 11/409; G11C 2211/4065; G11C 29/022; G11C 29/4401; G11C 29/46; G11C 29/781; G11C 29/814; G11C 29/824; G11C 11/4076; G11C 11/4078; G11C 11/408; G11C 2211/4068; G11C 7/24; G11C 11/40626; G11C 2029/0409; G11C 29/023; G11C 29/44; G11C 7/02; G11C 11/4096; G06F 21/554; G06F 2221/034; G06F 3/0614; G06F 3/0656
  See application file for complete search history.

(56) References Cited

U.S. PATENT DOCUMENTS

| | | | |
|---|---|---|---|
| 9,214,216 B2 | 12/2015 | Kim | |
| 10,885,966 B1 | 1/2021 | Devaux | |
| 2017/0213586 A1 | 7/2017 | Kang | |
| 2019/0228813 A1* | 7/2019 | Nale | G06F 3/0619 |
| 2021/0012832 A1 | 1/2021 | Devaux | |

OTHER PUBLICATIONS

International Search Report for PCT/FR2022/050523, Jul. 4, 2022, 2 pages.

* cited by examiner

MEMORY DEVICE AND METHOD FOR PROTECTING A MEMORY DEVICE FROM THE EFFECT OF ROW HAMMERING

FIELD OF THE INVENTION

The present invention relates to the field of DRAM circuits ("dynamic random access memory") and particularly the management of the "row hammering" effect. This "row hammering" effect is the fact that, within a bank of a given DRAM memory, repeatedly activating a row of the given DRAM could cause the physically adjacent rows to invert the value of some of their bits. The row that is activated repeatedly is called the "aggressor row" and the adjacent rows are called the "victim rows". Row hammering of reach p means that an aggressor row of topological index i, is capable of assigning victim rows between the topological indices i–p and i+p. The more topologically distant a victim row is from the aggressor row (that is to say that the more the index of the victim row differs from the index of the aggressor row), the lower this impact will be. This reach is dependent on numerous factors, in particular the fineness of etching of the DRAM memory. It can be estimated or measured for a given type of DRAM memory.

Technological Background of the Invention

It will be recalled that the DRAM memory of a conventional computer system is usually formed by sticks (for example in DIMM format) of DRAM chips. Each stick is subdivided into a plurality of rows ("ranks") each formed of a portion of the DRAM chips. Each rank is itself subdivided into logic banks extending over the DRAM chips of that row. The portion of a bank of a DRAM chip incorporates a plurality of matrices (also referred to as a "mat") of memory points. This matrix forms an elementary hardware organization of the memory points of a DRAM chip, and each matrix has a certain degree of independence with respect to the others and is in particular isolated from the point of view of the row hammering of the other matrices of this chip, in particular by row-and-column decoding circuits, and by amplification circuits ("sense amplifiers"). The matrix is itself formed of topologically contiguous rows of memory points, generally several hundred rows per matrix.

It is known that the DRAM must be refreshed, that is to say that the rows that compose it must be read and re-written periodically without modifications, for the purpose of preventing the loss of information. These operations of refreshing ranks are usually designated "periodic refreshes", and are carried out in the form of cycles leading to the refreshing of all the rows of the memory.

Document U.S. Pat. No. 9,214,216 proposes a method for protecting a DRAM memory device from row hammering. This method consists of counting accesses to the memory point matrices via a plurality of counters respectively associated with these matrices. Whenever a counter associated with one of the memory point matrices exceeds a threshold value, that matrix is entirely refreshed (that is to say all of its rows are) in order to avoid the occurrence of an error caused by hammering. This method is based on the fact that the victim rows are necessarily confined to the memory point matrix of the aggressor row, since these matrices are physically isolated from one another: an aggressor row cannot create victim rows outside its own matrix, even when the range of the hammering is large.

This solution is however unsatisfactory, since it depends on the property of the matrices to be physically and electrically isolated from one another from the point of view of row hammering. However, the size of the matrices may prove to be too large to allow optimal management of the prevention of row hammering.

OBJECT OF THE INVENTION

An aim of the invention is to propose a solution for improving this state of the art. More precisely, an object of the invention is to provide a method for protecting a memory device DRAM from row hammering which does not depend on the immunity of the blocks from one another, and which makes it possible to prevent more effective row hammering.

BRIEF DESCRIPTION OF THE INVENTION

In order to achieve this aim, the subject matter of the invention proposes a method for protecting a memory device from the row hammering effect, the memory device comprising a DRAM unit formed from a plurality of memory point matrices subdivided into a plurality of memory blocks composed of contiguous memory rows, and the memory device also comprising activation counters respectively associated with the memory blocks.

The method comprises the following operations:

executing, on each activation of a row of a given block, a step of incrementing the activation counter associated with the given block, initiating the preventive refresh of all rows of the given block, when the activation counter of that given block exceeds a threshold value and resetting the counter associated with the given block.

The method also comprises at least one of the operations aimed at:

including, in the preventive refresh, at least a portion of the rows of at least one block directly adjacent to the given block, and/or incrementing, during the activation of the row or of certain rows of the given block, the activation counter of at least one block directly adjacent to the given block and initiating the preventive refresh of all the rows of the adjacent block, when the activation counter associated with this adjacent block exceeds a threshold value (Si–1, Si+1).

In general, in these explanations, any incrementation of an activation counter will trigger a refresh of the block associated with that counter if that counter reaches the threshold value, independently of the cause of this incrementation: whether it is an increment due to an activation targeting that block precisely, or an increment due to an activation targeting a block directly adjacent or indirectly adjacent and in the hammering range. The triggering of the refresh of a given block following the incrementation of the associated counter triggers the resetting of this counter, typically to zero. It should be noted that the fact that another block besides that given block is entirely or partially refreshed because it is included in the preventive refresh associated with the given block does not lead to the resetting of the counter associated with that other block, only the counter of the given block being reset to 0.

According to other advantageous and non-limiting features of the invention, either individually or in any technically feasible combination:

the preventive refresh includes all rows of the at least one block directly adjacent to the given block, when the activation counter of that given block exceeds a threshold value;

the preventive refresh includes at least some of the rows of a plurality of blocks adjacent to the given memory block;

the preventive refresh includes, in addition to the rows of the given block, only a subset of the rows topologically contiguous to the given block, when the activation counter of that given block exceeds a threshold value;

the incrementing of the activation counter of the at least one block directly adjacent to the given block is performed upon activation of any row of the given block;

the incrementing of the activation counter of the at least one block directly adjacent to the given block is performed only upon activation of a subset of rows formed of the first and last rows of the given memory block;

the counters respectively associated with a plurality of blocks adjacent to the given memory block are incremented.

According to another aspect, the invention relates to a memory device comprising a DRAM unit formed from a plurality of memory point matrices subdivided into a plurality of memory blocks composed of contiguous memory rows.

The memory device comprises:

a prevention logic block associated with activation counters respectively associated with the memory blocks, the prevention logic block being configured to increment, upon each activation of a row of a given block, the activation counter associated with the given memory block;

a refresh logic block configured to, when the activation counter of that given memory block exceeds a threshold value, reset the counter associated with the given block and initiate the preventive refresh of all the rows of the given memory block while including, in that preventive refresh, at least part of the rows of at least one block directly adjacent to the given memory block.

According to other advantageous non-limiting features of this aspect of the invention, taken alone or according to any technically feasible combination:

the activation counters are comprised in the prevention logic block;

the memory blocks are respectively each made up of a single memory row, and wherein an activation counter associated with a memory block consists of a reserved bit field of the memory row constituting that block;

the refresh logic block is configured to initiate the refresh of all rows of the at least one block directly adjacent to the given memory block, when the activation counter of that given memory block exceeds a threshold value;

the refresh logic block is configured to initiate the refresh, in addition to the set of rows of the given memory block, of only a subset of the rows topologically contiguous to the given block, when the activation counter of that given block exceeds a threshold value.

According to yet another aspect of the invention, it relates to a memory device comprising a DRAM unit formed from a plurality of memory point matrices subdivided into a plurality of memory blocks composed of contiguous memory rows.

The memory device according to this aspect of the invention comprises:

a prevention logic block comprising activation counters respectively associated with the memory blocks, the prevention logic block being configured to increment, upon each activation of a row of a given block, the activation counter associated with the given memory block as well as at least one activation counter associated with at least one block directly adjacent to the given memory block;

a refresh logic block configured to, when an activation counter associated with a determined memory block exceeds a threshold value, initiate the preventive refresh of all rows of the determined memory block and reset the counter associated with that determined block.

According to other advantageous non-limiting features of this aspect of the invention, taken alone or according to any technically feasible combination:

the prevention logic block is configured to increment the at least one activation counter associated with at least one block directly adjacent to the given block upon activation of any row of the given block;

the prevention logic block is configured to increment the at least one activation counter associated with at least one block directly adjacent to the given block only upon activation of a subset of rows formed of the first and/or last rows of the given memory block.

The memory device according to either of the aspects of the invention may comprise a DRAM chip, a memory controller or a buffer circuit, and the prevention and refresh logic blocks are comprised in the DRAM chip, in the memory controller, or in the buffer circuit.

BRIEF DESCRIPTION OF THE DRAWINGS

Other features and advantages of the invention will emerge from the following detailed description of the invention with reference to the appended figures, in which.

DETAILED DESCRIPTION OF THE INVENTION

Figure 1:
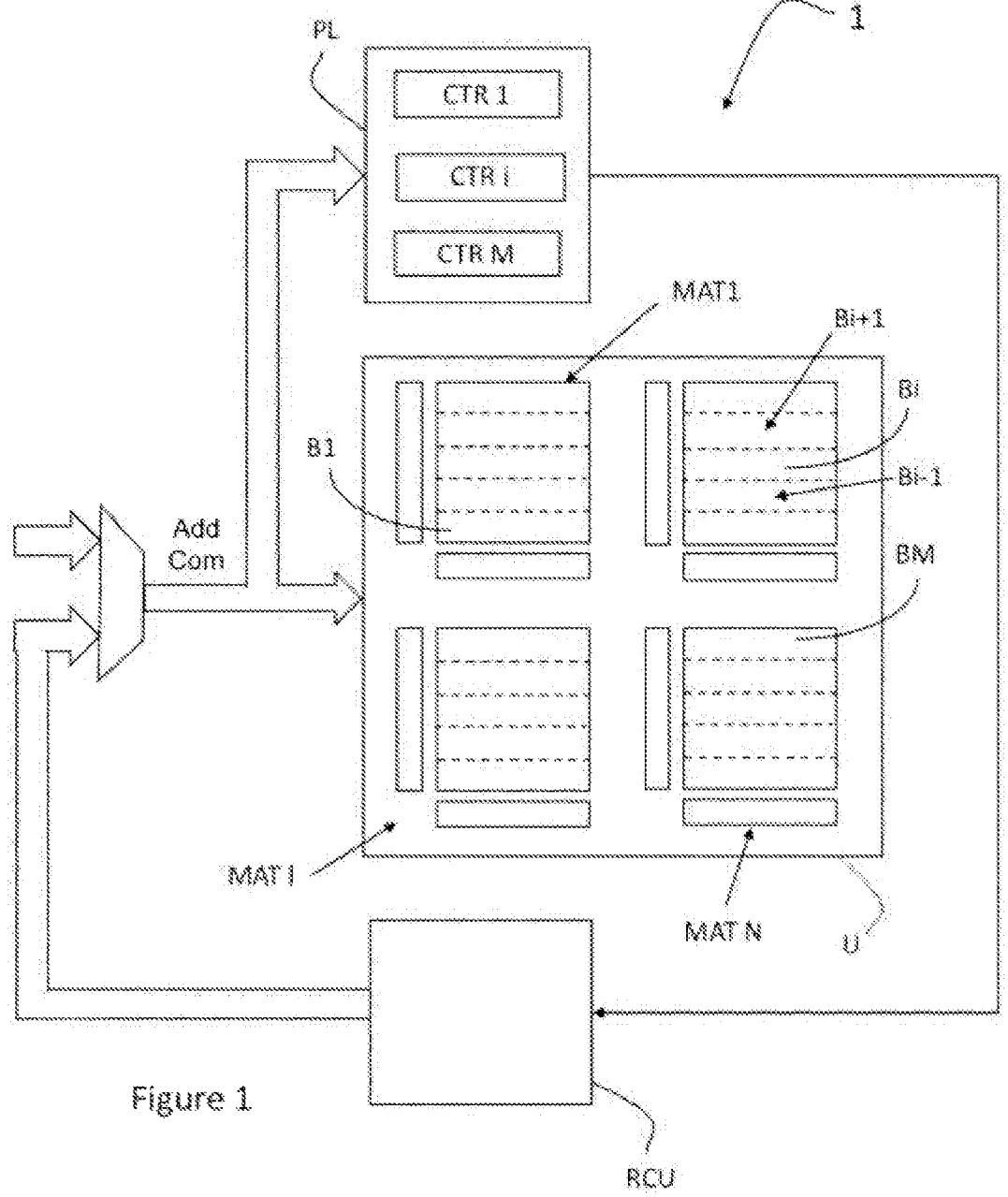
FIG. 1 shows a DRAM memory device making it possible to implement a protection method according to the invention.

FIG. 1 shows a memory device 1 making it possible to implement a protection method according to the invention.

The device 1 comprises a DRAM unit U composed of a plurality of memory point matrices of MAT1-MATN, more simply referred to as "matrices" in the rest of this description. As has been presented in the introduction of this application, such matrices are composed of rows of topologically contiguous memory points. They are isolated, from the point of view of row hammering, from one another, in particular by circuits for decoding rows and columns, and amplification circuits. The activation of a row of a determined matrix MAT1, even repeated, cannot generate victim rows of this hammering in a separate matrix. In other words, the victim rows of the hammering of an aggressor row of a determined matrix MAT1 necessarily belong to the same determined matrix MAT1 as that aggressor row.

In the memory device 1 of FIG. 1, the matrices MAT1-MATN of the DRAM unit U can be included in a DRAM chip or in a plurality of such chips, arranged for example on a stick. The DRAM unit U may correspond to a physical or logical partition of at least some of the matrices making up the DRAM memory device 1. This device 1 may comprise more than one DRAM unit U.

In the memory device 1 shown in FIG. 1, the DRAM unit U is associated with at least one refresh logic block RCU. This logic block RCU implements operations for refreshing the rows of the matrices MAT1-MATN making up the DRAM unit U of the device 1. These refreshes may correspond to periodic refreshes of the rows of the U unit or to preventive refreshes aimed specifically at preventing row hammering, as will be presented in more detail in the rest of this description.

A memory device according to the invention may comprise a plurality of such refresh logic blocks RCU, for example a refresh logic block RCU in each DRAM chip when the DRAM unit U is composed of matrices MAT1-MATN coming from a plurality of DRAM chips. The refresh logic block or the plurality of refresh logic blocks RCU associated with a DRAM unit U may alternatively be comprised in a memory controller of the device 1 or in a buffer circuit of this device 1.

The refresh logic block RCU coordinates and initiates the operations of refreshing the rows composing the DRAM unit U, and in particular the periodic refreshes and the preventive refreshes of the rows of that DRAM unit. The block may in particular be configured to initiate the insertion of the preventive refreshes in the control traffic to the DRAM unit U. This may be done, for example and without this list forming an exhaustive enumeration, in one of the following ways:

by borrowing periodic refresh time slots, periodic refreshes being delayed for a sufficiently short period so that this does not pose any problems;

by having in the memory protocol, a sufficient quota of time slots reserved for preventive refreshes;

indicating to a memory controller that it is to generate one or more time slots for preventive refreshes.

The insertion of the preventive refreshes in the control traffic to the DRAM unit U depends on the architecture of the memory device 1 and the protocols implemented. This architecture can thus implement, apart from the DRAM chips themselves, a memory controller and/or a buffer circuit (for example known by the acronym RCD) between the memory controller and the DRAM chips. Other approaches, whether or not requiring coordination with a memory controller, can also be used.

In the memory device DRAM 1 shown in FIG. 1, the DRAM unit U is also associated with at least one prevention logic block PL. This logic block PL is intended to protect that DRAM unit U from row hammering. Like the refresh logic block RCU, a memory device 1 according to the invention 1 may comprise a single logic block or a plurality of logic blocks for prevention PL, integrated into the DRAM chips which compose the device 1, into a memory controller of this device 1, or into a buffer circuit of this device 1.

The prevention logic block PL receives the commands Cde and the addresses Add for accessing the rows composing the DRAM unit U. The prevention logic block PL comprises or is associated with a plurality of activation counters CTR1-CTM. The activation counters CTR1-CTM are respectively associated with blocks of memory rows B1-BM. A block of memory rows (more simply referred to as a "memory block" in the rest of this description) consists of a grouping of topologically contiguous rows inside a matrix of rows MAT. In other words, and as can be seen in FIG. 1, each matrix is subdivided into a plurality of memory blocks of topologically contiguous rows. Each memory block Bi is therefore adjacent to a memory block directly lower Bi−1 and to a memory block directly higher Bi+1, except of course for the first memory block and the last memory block of a matrix. It is not necessary for the matrices MAT1-MATN to all be subdivided into an identical number of memory blocks.

In any case, and regardless of how the matrices MAT1-MATN of the DRAM unit U are divided into contiguous memory blocks B1-BM, the prevention logic block PL comprises, or is associated with, activation counters CTR1-CTM respectively associated with the memory blocks B1-BM. By way of illustration only, a memory block B can be composed of 32 memory rows and a matrix MAT may typically comprise between 8 and 16 memory blocks.

The prevention logic block PL is configured to, upon each command to activate a row of a given memory block Bi (and designated at least in part by the address Add), increment the activation counter CTRi associated with that given memory block Bi.

The memory blocks B1-BM are also respectively associated, in the prevention logic block PL, with threshold values. When the activation counter CTRi associated with a block Bi exceeds the threshold value Si associated with that block, all the rows composing that memory block Bi must be refreshed. The threshold values may be identical to each other or specific to each memory block. They can be fixed or determined (collectively or individually) for each memory block, for example at the end of a method of testing the components forming the device 1, depending on the sensitivity of these components to hammering. It is possible to consider varying these threshold values, for example with the operating temperature of the device 1, as a relatively higher temperature makes certain components generally more sensitive to hammering. Typically, and for illustration only, this threshold may be between 4000 and 8000.

To ensure this operation, the prevention logic block PL is therefore configured to compare the value of a counter Bi with the threshold value Si associated with it, after each incrementation of this counter CTRi, that is to say after each activation of a row of the block Bi associated with the counter CTRi. In the event that this threshold value is met or exceeded, the prevention logic block PL sends a command to the refresh logic block RCU to initiate the refreshing of the entire memory block Bi, that is to say the refreshing of the set of rows that compose this memory block Bi. To this end, the refresh logic block RCU may comprise a table for storing the memory blocks or the rows designated by the prevention logic block PL, waiting for their preventive refresh. The counter CTRi is then reset to zero, in order to begin a new incrementation cycle.

However, this approach is not sufficient to completely immunize the DRAM unit U from hammering by certain aggressor rows. Indeed, the repeated activation of one row of a block may affect the row of an adjacent memory block of the same matrix, since the memory blocks of a particular matrix are not physically isolated from each other. The preventive refresh of a given block therefore cannot prevent hammering that would occur on a victim row of an adjacent block.

When the range of the hammering is less than the size of a block, the effect of hammering a row of a given block Bi can extend to a victim row of the adjacent blocks Bi−1 and Bi+1.

In the most general case, and without assuming that the range is necessarily less than the size of a block, the effect of hammering a row of a given block Bi can extend to a victim row of the adjacent blocks Bi−k-Bi+k, the indices of which are therefore comprised between i−k and i+k (the index i being excluded), with $k=1+E[(p-1)/n]$, where the function E is the integer part, p the range of the hammering and n the size of a block. In other words, in an approach in accordance with the invention, it is assumed for the sake of simplifying the algorithm that the hammering by an aggressor row i is identical for the 2p adjacent rows (p victim rows on either side of that aggressor row), and that this effect can therefore appear with the same intensity in all the blocks that intersect these 2p adjacent rows.

Figure 2A:
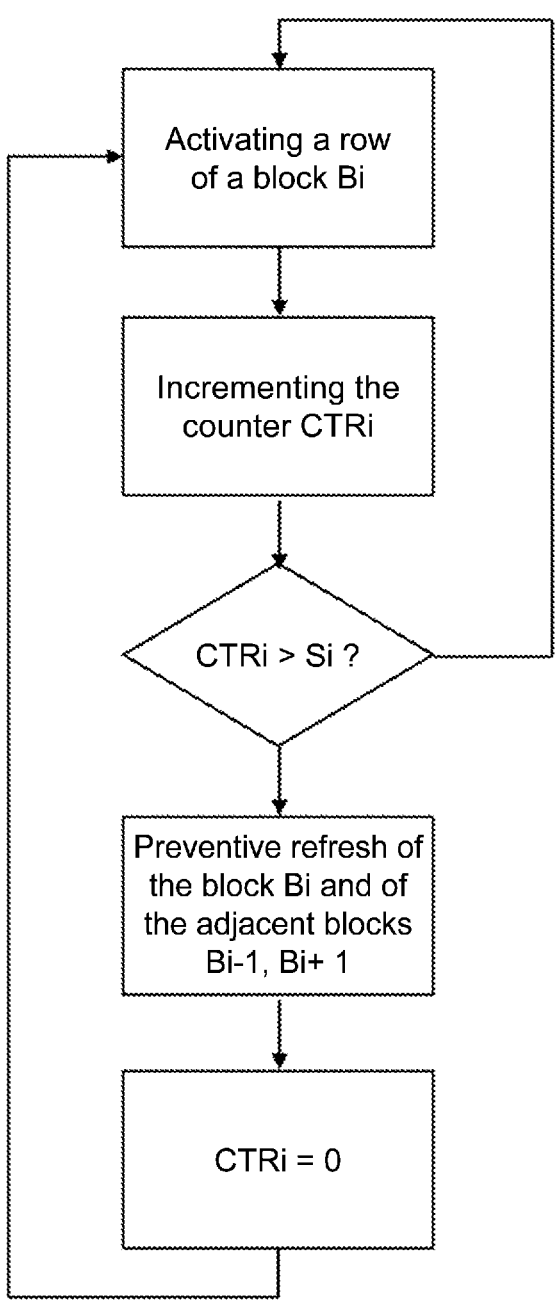
FIGS. 2a and 2b show protection methods according to the invention.
Figure 2B:
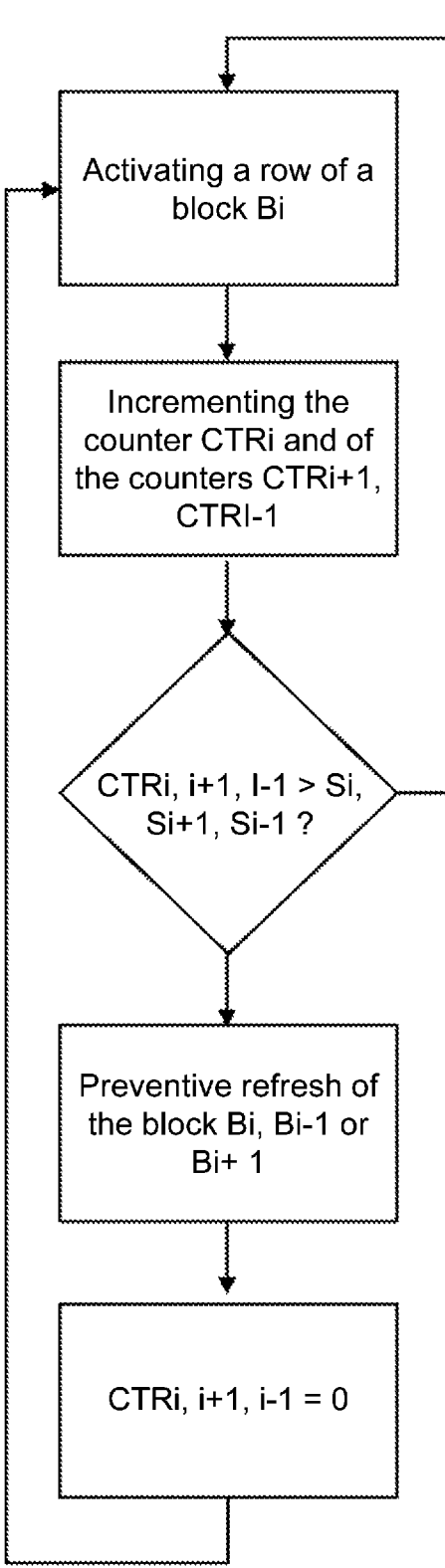

Also, and in order to prevent, limit or reduce this risk linked to the hammering of a row of the DRAM unit U, a memory device according to the invention is increased by at least one of two additional logic mechanisms, shown respectively in FIGS. 2a and 2b.

In these Figures, the operations already presented to increment the counter CTRi upon activation of a row of a block Bi associated with that counter are shown. The operation of comparing the counter CTRi with the associated threshold Si is also shown, as is the operation of refreshing the integer block Bi, if that threshold Si is reached or exceeded.

In the following explanations of the invention, it is assumed that the size of the blocks of a matrix is greater than or equal to the hammering range p. As a result of this assumption, the extent k defined above is equal to 1, that is to say that the effect of hammering a row of a block is confined to the blocks directly adjacent. These explanations will be extended at any end of the description to blocks of all sizes.

According to a first approach shown in FIG. 2a, the memory device 1 is not only configured to initiate the preventive refresh of all rows of a given memory block Bi for which the activation threshold value Si has been exceeded or reached, but also at least part of the rows of the one or more blocks Bi−1, Bi+1 topologically adjacent to that given memory block Bi, that is to say of the block directly higher Bi+1 and/or directly lower Bi−1.

The term "refresh zone" refers to all of the rows refreshed when the counter CTRi of a given block Bi reaches or exceeds the threshold value. This refresh zone must at least comprise the p rows arranged on one side and/or the other of the given block Bi, contiguously to that block, p designating the hammering range.

Thus, it will be possible to choose, in the refresh zone, all the rows of the two blocks Bi−1, Bi+1 directly adjacent to the given memory block Bi. However, it is not necessary for all the rows of both of the two directly adjacent blocks Bi−1, Bi+1 to be included in the refresh zone. In one variant, it is thus possible to choose to include in this zone only a subset of at least p rows of these memory blocks directly topologically contiguous to the given block, that is to say on either side of that block.

If, of course, the given memory block is arranged at one end of a matrix, that is to say that it consists of the first rows or the last rows of the matrix, then it has only one adjacent block, and the refresh of that given memory block is extended only by rows belonging to that single adjacent memory block. For simplicity's sake, the term "adjacent blocks" of a given block will be used to designate the blocks or block adjacent to a given block depending on whether that given block is arranged in a central part of a matrix or at one end of the matrix.

To implement this first approach, the refresh logic block RCU can be configured to systematically initiate the refresh of the rows forming the refresh zone of the given memory block Bi and a reference of which is provided by the prevention logic block PL. Alternatively, the prevention logic block PL can provide the refresh logic block RCU with the references of the blocks and/or rows constituting the refresh zone of the given memory block.

According to a second approach shown in FIG. 2b aimed at preventing the effects of hammering from one memory block to another, the prevention logic block PL may be configured to increment, during the activation of a row of a given memory block, the activation counter associated with the directly adjacent memory blocks Bi−1, Bi+1, that is to say of the memory block directly higher Bi+1 and directly lower Bi−1 than the given block Bi. This additional incrementation can be carried out during the activation of any row of the given memory block whatsoever.

According to a variant of the second approach, the additional incrementations are carried out as a function of the row which is activated in the block Bi: if the range of the hammering is p, then the activation of the p first rows of the given block Bi causes the incrementation of the counter associated with the directly lower adjacent block Bi−1, the activation of the last p rows of the given block Bi leads to the incrementation of the counter associated with the directly higher adjacent block Bi+1, and:

If the range p is less than half the number of rows of the given block Bi, then the activation of the other rows than the first p or last p of that block does not lead to incrementing the counters associated with the blocks Bi−1 and Bi+1, If the range p is greater than half of the number of rows of the given block Bi, then the activation of the rows which belong to both the first p rows and the last p row of that block causes the incrementation of the counters associated with the blocks Bi−1 and Bi+1.

If, of course and just as in the first approach, the given memory block Bi is arranged at one end of a matrix, that is to say that it consists of the first rows or the last rows of the matrix, then it has only one adjacent block, and the additional incrementation relates only to the counter associated with that single adjacent memory block.

These two approaches and their variants can be easily adapted to the case where the range p of the hammering is strictly greater than the size n of the block:

for the first approach or its variant, the refresh zone of the given block Bi is enlarged in such a way that it encompasses as many adjacent blocks of the given block Bi as necessary, in a non-limiting example, the refresh zone may comprise: some of the last rows of the blocks Bi−2, the entirety of the rows of the blocks Bi−1, Bi, Bi+1, and some of the first rows of the block Bi+2. More generally, it will be possible to choose, in the refresh zone, a plurality of blocks Bi−1 to Bi−k on the one hand and Bi+1 to Bi+k on the other hand, adjacent to the given memory block Bi itself, where k=1+E[(p−1)/n]. Again, all the rows of the end blocks Bi−k, Bi+k can be included in the refresh zone, or only subsets of rows respectively contiguous with the blocks Bi−k+1, Bi+k−1 of indices i−k+1 and i+k−1.

For the second approach, the number of blocks whose associated counters are incremented as far as necessary, in a non-limiting example, to activate a row of a given block Bi will increment the counters associated with the blocks Bi−2, Bi−1, Bi, Bi+1, Bi+2. More specifically, the prevention logic block PL may be configured to increment the activation counters respectively associated with the memory blocks Bi−k to Bi+k of indices i−k to i+k, where k=1+E[(p−1)/n].

For the variant of the second approach, the counters associated with the adjacent blocks closest to the given block Bi are incremented on each activation of a row of Bi, and the counters associated with the two adjacent blocks closest to the given block Bi are incremented or not as a function of the precise row of the given block Bi which has been activated. In a non-limiting example, activating a row of a given block Bi may always increment the counters CTRi−1, CTRi, CTRi+1 associated with that block and with the directly adjacent blocks Bi−1, Bi, Bi+1, and increment, contingent on the precise row of the given block Bi activated, the counters CTRi−2, CTRi+2 associated with the blocks Bi−2, B+2 that are not directly adjacent.

When the blocks considered are located at the ends of the mat, or close thereto, some of the adjacent blocks will not be present, and the approach described is therefore adapted accordingly.

Thus, and whatever the approach chosen from the approaches that have just been presented or their variants, the row hammering which can occur between directly or indirectly adjacent memory blocks of a matrix is prevented, even when the range of the hammering is large relative to the size of the block. The preventive refresh initiated by the refresh logic block RCU mobilizes a reduced number of rows at each preventive refresh phase relative to the total number of rows contained in a matrix MAT, which is particularly advantageous.

It is noted that the preventive and periodic refreshes that are initiated by the refresh logic block also contribute to hammering. Also, the activations of rows that occur during these refreshes must be taken into account by the prevention logic block PL, unless sufficient margins have been considered in the counting thresholds triggering the preventive refresh operations, so that this is not necessary.

Naturally, the invention is not limited to the embodiments described, and it is possible to add alternative embodiments without departing from the scope of the invention as defined by the claims.

In particular, the operations of the protection method can be implemented by other logic blocks than the preventive PL and refresh RCU blocks, which have been explained in the detailed description, or distributed between these blocks in a different manner to that presented in this description.

The prevention logic block may in particular be implemented by two logics that are executed asynchronously. A first logic can thus be configured to increment the counter associated with a given memory block, during the activation of a row of this block and, optionally in the case of the second approach and its variant, the counters of the blocks directly or indirectly adjacent. A second logic can be configured to scan, asynchronously to the first logic, all of the counters CTR1-CTRM, and control the refresh logic block when one of these counters reaches or exceeds the threshold associated therewith. In such a case, this second logic can be responsible for resetting the counter. Thus, generally, the refresh logic block is configured to initiate the preventive refresh of all rows of a block, when the activation counter associated with this block exceeds a threshold value.

The logic blocks that implement the method according to the invention may correspond to state machines.

It should be noted that in a particular embodiment of the invention, the size of the blocks is 1 row only. In this embodiment, the activation counter associated with each block can be produced by enlarging each row of the matrix by a sufficiently wide field of bits to store an activation value corresponding to the threshold value, i.e. a field of 13 bits when the threshold value is chosen to be 8000. This embodiment is particularly suited to the first approach of the invention. This configuration is advantageous in that the activation counter is produced by the enlargement of the row is more economical than can be carried out via the use of a dedicated memory.

The invention claimed is:

1. A method for protecting a memory device (1) from row hammering, the memory device (1) comprising a DRAM unit (U) formed from a plurality of memory point matrices (MAT1-MATN) subdivided into a plurality of memory blocks (B1-BM) composed of contiguous memory rows, and the memory device (1) also comprising activation counters (CTR1-CTM) respectively associated with the memory blocks (B1-BM), the method comprising the following operations:

executing, on each activation of a row of a given block (Bi), a step of incrementing the activation counter (CTRi) associated with the given block (Bi);

initiating a preventive refresh of all rows of the given block (Bi), when the activation counter (CTRi) of that given block (Bi) exceeds a threshold value (Si) and resetting the counter (CTRi) associated with the given block (Bi);

the protection method also comprising at least one of the operations aimed at:

including, in the preventive refresh, at least a portion of the rows of at least one block (Bi+1, Bi−1) directly adjacent to the given block (Bi), and/or incrementing, during the activation of the row or of certain rows of the given block (Bi), the activation counter (CTRi−1, CTRi+1) of at least one block (Bi−1, Bi+1) directly adjacent to the given block (Bi) and initiating the preventive refresh of all the rows of the at least one directly adjacent block (Bi−1, Bi+1), when the activation counter (CTRi−1, CTRi+1) associated with this adjacent block (Bi−1, Bi+1) exceeds a threshold value (Si−1, Si+1).

2. The protection method according to claim 1, wherein the preventive refresh includes all rows of the at least one block (Bi+1, Bi−1) directly adjacent to the given block (Bi), when the activation counter (CTRi) of that given block (Bi) exceeds a threshold value (Si).

3. The protection method according to claim 1, wherein the preventive refresh includes at least some of the rows of a plurality of blocks (Bi−k, Bi−1; Bi+1, Bi+k) adjacent to the given memory block (Bi).

4. The protection method according to claim 1, wherein the preventive refresh includes, in addition to the rows of the given block (Bi), only a subset of the rows topologically contiguous to the given block (Bi), when the activation counter (CTRi) of that given block (Bi) exceeds a threshold value (Si).

5. The protection method according to claim 1, wherein the incrementing of the activation counter (CTRi−1, CTRi+1) of the at least one block (Bi−1, Bi+1) directly adjacent to the given block (Bi) is carried out during the activation of any row of the given block (Bi).

6. The protection method according to claim 1, wherein the incrementing of the activation counter (CTRi−1, CTRi+1) of the at least one block (Bi−1, Bi+1) directly adjacent to the given block (Bi) is performed only upon activation of a subset of rows formed of the first and last rows of the given memory block (Bi).

7. The protection method according to claim 1, wherein the counters (CTRi-k, CTRi−1; CTRi+1, CTRi+k) respectively associated with a plurality of blocks (Bi−k, Bi−1; Bi+1, Bi+k) adjacent to the given memory block (Bi) are incremented.

8. A memory device (1) comprising a DRAM unit (U) formed of a plurality of memory point matrices (MAT1-MATN) subdivided into a plurality of memory blocks (B1-BM) composed of contiguous memory rows, the memory device comprising:

a prevention logic block (PL) associated with activation counters (CTR1-CTRM) respectively associated with the memory blocks (B1-BM), the prevention logic block (PL) being configured to increment, upon each activation of a row of a given block (Bi), the activation counter (CTRi) associated with the given memory block (Bi);

a refresh logic block (RCU) configured to, when the activation counter (CTRi) of that given memory block (Bi) exceeds a threshold value (Si), reset the counter (CTRi) associated with the given block (Bi) and initiate the preventive refresh of all the rows of the given memory block (Bi) while including, in that preventive refresh, at least part of the rows of at least one block (Bi+1, Bi−1) directly adjacent to the given memory block (Bi).

9. The memory device (1) according to claim 8, wherein the activation counters (CTR1-CTM) are included in the prevention logic block (PL).

10. The memory device (1) according to claim 8, wherein the memory blocks (B1-BM) are respectively each made up of a single memory row, and wherein an activation counter associated with a memory block consists of a reserved bit field of the memory row constituting that block.

11. The memory device (1) according to claim 8, wherein the refresh logic block (RCU) is configured to initiate the refresh of all rows of the at least one block (Bi−1, Bi+1) directly adjacent to the given memory block (Bi), when the activation counter (CTRi) of that given memory block exceeds a threshold value (Si).

12. The memory device (1) according to claim 8, wherein the refresh logic block (RCU) is configured to initiate the refresh of a subset only of topologically contiguous rows to the given block (Bi), when the activation counter (CTRi) of this given block (Bi) exceeds a threshold value (Si).

13. A memory device (1) comprising a DRAM unit (U) formed of a plurality of memory point matrices (MAT1-MATN) subdivided into a plurality of memory blocks (B1-BM) composed of contiguous memory rows, the memory device comprising:

a prevention logic block (PL) comprising activation counters (CTR1-CTRM) respectively associated with the memory blocks (B1-BM), the prevention logic block (PL) being configured to increment, upon each activation of a row of a given block (Bi), the activation counter (CTRi) associated with the given memory block (Bi) as well as at least one activation counter (CTRi−1, CTRi+1) associated with at least one block (Bi−1, Bi+1) directly adjacent to the given memory block (Bi);

a refresh logic block (RCU) configured to, when an activation counter associated with a determined memory block exceeds a threshold value, initiate the preventive refresh of all rows of the determined memory block and reset the counter associated with that determined block.

14. The memory device (1) according to claim 13, wherein the prevention logic block (PL) is configured to increment the at least one activation counter (CTRi-1, CTRi+1) associated with at least one block (Bi−1, Bi+1) directly adjacent to the given block (Bi) upon activation of any row of the given block (Bi).

15. The memory device (1) according to claim 13, wherein the prevention logic block (PL) is configured to increment the at least one activation counter (CTRi-1, CTRi+1) associated with at least one block (Bi−1, Bi+1) directly adjacent to the given block (Bi) only upon activation of a subset of rows formed of the first and/or last rows of the given memory block (Bi).

16. The memory device (1) according to claim 13, comprising a DRAM chip, a memory controller or a buffer circuit, and wherein the prevention and refresh logic blocks (RCU) are comprised in the DRAM chip, in the memory controller, or in the buffer circuit.

* * * * *